United States Patent [19]

Makosch

[11] Patent Number: 4,779,001

[45] Date of Patent: Oct. 18, 1988

[54] INTERFEROMETRIC MASK-WAFER ALIGNMENT

[75] Inventor: Guenter Makosch, Sindelfingen, Fed. Rep. of Germany

[73] Assignee: International Business Machines Corporation, Armonk, N.Y.

[21] Appl. No.: 37,678

[22] Filed: Apr. 13, 1987

[30] Foreign Application Priority Data

Apr. 29, 1986 [EP] European Pat. Off. ........ 86105893.1

[51] Int. Cl.⁴ ................................................ G01V 9/04

[52] U.S. Cl. ...................................... 250/548; 356/401

[58] Field of Search ................ 250/548, 557; 356/400, 356/401, 356, 351, 354, 355

[56] References Cited

U.S. PATENT DOCUMENTS

| | | | |
|---|---|---|---|
| 4,402,610 | 9/1983 | Lacombat | 356/400 |
| 4,577,968 | 3/1986 | Makosch | 356/356 |
| 4,631,416 | 12/1986 | Trutna, Jr. | 356/356 |
| 4,664,524 | 5/1987 | Hattori et al. | 356/356 |
| 4,710,026 | 12/1987 | Magome et al. | 356/356 |

OTHER PUBLICATIONS

H. I. Smith et al., "Alignment of X-Ray Lithography Masks Using a New Interferometric Technique-Experimental Results," *J. Vac. Sci. Technol.,* May/Jun. 78, pp. 984–986.

G. Makosch et al., "Interferometric Method for Checking the Mask Alignment Precision in the Lithographic Process," *Applied Optics,* vol. 23, No. 4, Feb. 84, pp. 628–632.

H. P. Kleinknecht, "Diffraction Gratings as Keys for Automatic Alignment in Proximity and Projection Printing," *Society of Photo-Optical Instru. Engrs.,* vol. 174, 1969, pp. 63–69.

*Primary Examiner*—David C. Nelms
*Assistant Examiner*—Jessie Ruoff
*Attorney, Agent, or Firm*—Stephen J. Limanek

[57] ABSTRACT

To align a grating on a mask with respect to an equivalent grating of a wafer in a photolithographic system where the mask is imaged by an imaging system onto the wafer, symmetrical diffraction orders ($u^\circ_{+1}$, $u^\circ_{-1}$) are focussed on the wafer grating and diffracted a second time to return colinear with the optical axis and to be deflected by a beam splitter to a photo detector. The intensity of the superimposed outbeams depends on the relative phase differences of the diffracted beams, and, hence, on the displacements of the mask and wafer gratings. The phase of the electrical output signal is determined by introducing periodic phase differences in the diffracted beams of the mask grating by a wobbling parallel glass plate. For simultaneous X-, Y- alignment, crossed gratings are used that operate on two pairs of diffracted beams. The polarization direction of one of these pairs is rotated by 90° before impinging on the second grating so that each pair of diffracted beams can be fed to a separate photodetector. In a step-and-repeat photolithographic system, optical fine alignment can be performed by adjusting a fixed tilt angle of the glass plate after having determined the amount of misalignment.

10 Claims, 3 Drawing Sheets

LASER
2
20
1
21
3a
3
4
d
5
6
7
8a
8

INTERFEROMETRIC MASK-WAFER ALIGNMENT

DESCRIPTION

1. Technical Field

The invention relates to a method and an arrangement for aligning two objects in a photolithographic system.

2. Background Art

Modern manufacturing methods often require two objects to be precisely aligned with respect to each other; this requirement is particularly important in optical or corpuscular-beam lithography which is used, e.g., for manufacturing highly integrated circuits. The alignment accuracy of a mask with respect to already existing structures on an object must be about 1/10 of the smallest dimensions that are to be defined; this need is difficult to be met with conventional alignment techniques now that line widths are decreasing under 1 μm. A further difficulty with high precision alignment is caused by the increasing size of the wafers (5 inches or more) which require a step-and-repeat process to transfer the image of the individual chip fields to the wafer. Preferably each chip field should then be aligned individually to compensate for distortions of the large wafer during hot process manufacturing steps. For high throughput such an individual alignment step should not take more than fractions of a second which is difficult to achieve with the required high precision.

Methods for automatic alignment have, therefore, been proposed along various lines. One of the methods makes use of image processing techniques where alignment marks on a mask are imaged onto corresponding marks on the wafer. The digital evaluation of this image yields alignment data. That method, however, requires a high quality optical system and clear wafer marks undisturbed by overlaying layers.

Periodic alignment marks have also been proposed to replace conventional marks like crosses, chevrons and the like. Gratings yield accurate displacement information and are rather insensitive to disturbances of individual grating lines. In an article "Alignment of x-ray lithography masks using a new interferometric technique-Experimental result," by D. C. Flanders and H. I. Smith, *Journal Vacuum Science Technology*, May/June 1978, Vol. 15(3), pp. 984–986, identical gratings are provided on both the mask and the wafer. Relative alignment of these gratings is indicated if symmetrical diffraction orders show the same intensity. Measurement of relative intensities, however, requires close control of the optical system. In addition, this method is only applicable to proximity printing.

H. P. Kleinknecht describes in *Society of Photo-Optical Instrumentation Engineers*, vol. 174, page 63 (1969), "Diffraction gratings as keys for automatic alignment in proximity and projection printing," where the mask grating has half the grating constant of the wafer grating so that new diffraction orders appear upon alignment. Therefore, this method is also based on intensity evaluations.

Commonly assigned U.S. Pat. No. 4,577,968, G. Makosch, "Method and Arrangment for Optical Distance Measurement," describes an overlay measurement technique where phase differences are measured that occur when a grating is displaced. For the overlay measurements two gratings on the wafer are evaluated, one of the gratings being generated from the mask adjacent to a reference grating. This is not suitable for the alignment process as such.

DISCLOSURE OF THE INVENTION

It is, therefore, an object of the present invention to provide a method and an arrangement for alignment of the aforementioned kind that yield high accuracy, operate with high speed, and are little disturbed by manufacturing influences.

This invention applies to a lithographic projection system where mask and wafer are arranged in two optically conjugate planes. An optical transmission grating is provided in the mask and illuminated by a collimated light beam, e.g., a laser. Two symmetrical diffraction orders, e.g., the ±1. orders, are then focussed by the imaging system in one common spot on the optical grating that is provided on the wafer and has the same grating constant as the image of the mask grating. The two incident diffraction orders are diffracted a second time at the wafer grating to return along the optical axes and to be deflected by a semi-transparent mirror to a photo detector whose output signal is evaluated for the relative phase difference of the two diffracted beams. For that purpose the phase of the two beams that are diffracted at the mask is changed periodically in three steps, e.g., by a thin oscillating glass plate arranged in series with the mask grating.

The proposed alignment method can be extended to two dimensions by using crossed gratings in the mask and wafer and by rotating the plane of polarization in the diffracted beams for the Y direction so that these beams can be separated by a polarizing beam splitter and be directed to a separate photo detector.

After the actual alignment has been measured the glass plate (or two glass plates with perpendicular axes of rotation) can be tilted to achieve fine alignment of the mask image with respect to the wafer without any further mechanical displacement.

The invention combines a very high alignment accuracy up to 25 nanometer with very short alignment times in the order of 0.1 seconds. This makes it particularly interesting for step-and-repeat projection systems with high throughput. Alignment can be performed in the X- and Y-directions. As the method is independent of the distance between the mask and wafer it can be applied to all projection systems and yields good alignment signals even if additional layers are deposited on the wafer grating and if a part of the grating is slightly distorted. The optical path for the alignment beams can be arranged at the periphery of known optical systems so that it can be incorporated without deteriorating the imaging quality.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
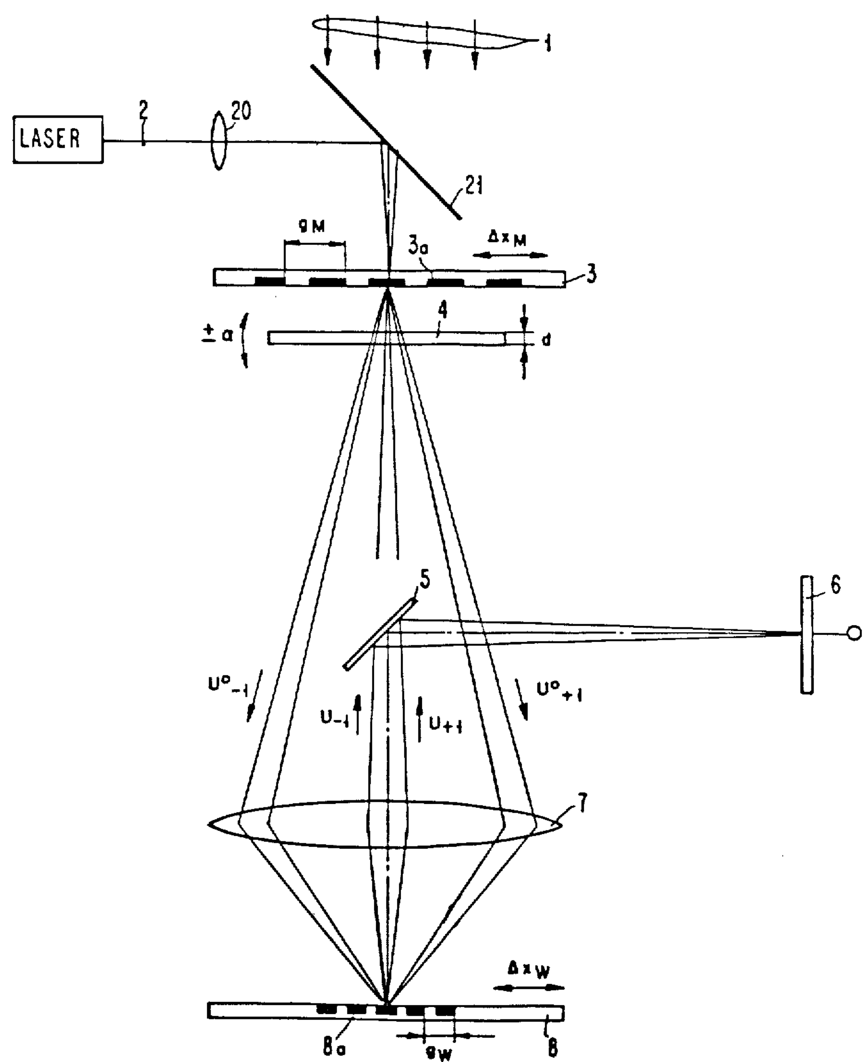
FIG. 1 shows a schematic diagram of a first embodiment of the invention which provides a one-dimensional alignment.

The principle of the invention is now discussed with reference to FIG. 1 which shows the key elements of a photolithographic system in which a beam of light 1 illuminates a photolithographic mask 3 that is imaged by optical system 7 onto a wafer 8 whose surface is covered with a photosensitive layer. Mask 3 contains in this embodiment a linear optical grating 3a with a grating constant $g_m$ and approximate dimensions of 100 $\mu m \times 100$ $\mu m$. This grating is a pure amplitude object and may be realized by a chromium pattern on the transparent mask substrate. It is preferably arranged in the kerf zones between the chip fields.

Before exposing mask 3 with beam 1 grating 3a has to be aligned with respect to a grating 8a on wafer 8 such that the image of grating 3a coincides with grating 8a. The grating constant $g_w$ of wafer grating 8a is, therefore, chosen in accordance with the linear magnification of optical system 7. In a 1:1 optical system the grating constant $g_m$ equals constant $g_w$.

The wafer grating is preferably generated by imaging the mask grating on the wafer covered with a photosensitive resist over a silicon dioxide layer and etching the latter to obtain a phase grating.

In the proposed automatic alignment system grating 3a is illuminated by a laser beam 2 to yield symmetrical orders of diffraction, the first two of which are selected (e.g., by diaphragms) as shown in FIG. 1 ($u^o_{-1}$, $u^o_{+1}$). Laser beam 2 is focussed by lens 20 to a spot of a size that covers some 10 periods of mask grating 3 and is deflected by dichroic mirror 21, which is transparent to the exposure beam 1. Optical system 7 collects the symmetrical orders of diffraction to recombine them on wafer grating 8a where they are reflected and again diffracted into 2. Orders to leave grating 8a as beams $u_{-1}$ and $u_{+1}$ travelling along the optical axis of the system. These reflected beams are diverted by beam splitter 5 to photo detector 6 which measures the intensity of these superimposed beams. Beam splitter 5 serves also to filter out the undiffracted beam passing through grating 3.

In the alignment process, the phase grating may be covered by other layers on the wafer so that its optical efficiency risks to be reduced. The oblique illumination by the diffraction orders of the mask grating and an appropriate choice of the thickness of a wafer grating silicon dioxide ($SiO_2$) layer counteract to this disturbing effect.

In a first step, coarse alignment is achieved by mechanically displacing either mask 3 or wafer 8 along the X direction to an accuracy of approximately $g_w/4$. If grating constants in the order of 10 $\mu m$ are used the accuracy of the pre-alignment step must be $\pm 2.5$ $\mu m$. This is achievable with conventional alignment systems, e.g., laser interferometrically controlled stages.

After this pre-alignment, fine alignment is performed using a proper tilt of a glass plate 4 and without further mechanical movement. The pre-alignment step is only required once per wafer.

The electrical output signal of photodetector 6 depends on the intensity and, therefore, on the relative phase of the interfering superimposed beams $u_{-1}$ and $u_{+1}$. As a displacement $\Delta X$ of a grating is known to generate a phase change of $$\Delta\pi = 4\pi\Delta X/g, \quad (1)$$

the phase of the electrical signal depends both on the position of the mask grating 3a and the wafer grating 8a. This phase difference may be represented by:

$$\psi_m = 4\pi\left(\frac{\Delta X_m}{g_m} + \frac{\Delta X_w}{g_w}\right). \quad (2)$$

If an additional phase shift of equal amount but of opposite sign is introduced by the glass plate in the diffracted beams $u^o_{-1}$ and $u^o_{+1}$ the beams to be superimposed at photodetector 6 may be represented in complex notation by:

$$u_{+1} = A \cdot e^{i}\left(\frac{\psi_m}{2} + \frac{\psi}{2}\right) \text{ and} \quad (3)$$

$$u_{-1} = A \cdot e^{i} - \left(\frac{\psi_m}{2} + \frac{\psi}{2}\right), \quad (4)$$

where A is the amplitude of the wave. The intensity measured at photodetector 6 is then:

$$J = |u_{+1} + u_{-1}|^2 = J_o\,|1 + \cos(\psi + \psi_M)| \quad (5)$$

$$J_o = 2A^2.$$

In the absence or at a horizontal position of the glass plate, alignment is achieved if $$\Delta X_M/g_M = -\Delta X_W/g_W \quad (6)$$

or equivalently $$\psi_M = 0. \quad (7)$$

The phase $\psi_M$ in the electrical output signal and, thus, the misalignment is determined by measuring the intensity at three points in the cosine function of equation (5) which are mutually spaced by $\frac{2}{3}\pi$. For that purpose the optical phase difference between partial beams $u_{+1}$ and $u_{-1}$ is varied from $\phi = 0$ to $\phi - \frac{2}{3}\pi$ and $\phi = -\frac{2}{3}\pi$ by means of tiltable glass plate 4 with thickness d that is arranged between mask 3 and optical system 7. If this glass plate is oriented horizontally, both diffracted beams pass symmetrically and have no relative phase difference. A tilt angle $\alpha$, however, introduces a mutual phase difference in the two beams of $$\psi = 4\pi \cdot \frac{d}{g_M} \cdot \sin\alpha \cdot \left(1 - \frac{\cos\alpha}{\sqrt{n^2 - \sin_2\alpha}}\right), \quad (8)$$

where d = thickness of the plate, and n = index of refraction, since each beam experience a different thickness of the plate on its path through the glass plate. Simultaneously the tilting causes a virtual displacement of the mask grating with respect to the wafer grating.

For a thickness $d = 300$ $\mu m$ and with a grid constant $g_M = 20$ $\mu m$ angles of $\alpha \pm 2°$, the required phase differences of $\pm\frac{2}{3}\pi$ are achieved.

If the intensities measured at these three tilt angles are then noted by $J_R$, $J_T$ and $J_S$, the phase $\Psi_m$ can be calculated from the equation $$\psi_m = \tan^{-1}\frac{\sqrt{3}\,(J_T - J_R)}{2\,J_S - J_R - J_T} \bmod 2\pi. \quad (9)$$

Equation 9 is known in the field of optical overlay measurements and has been cited in an article entitled "Interferometric method for checking the mask alignment precision in the lithographic process" by G. Makosch and F. J. Schones in Applied Optics, Vol. 23, no. 4, 14 February 1984, page 629, for an optical system that uses an electro-optical modulator to introduce phase shifts between partial beams.

During the measurement process the glass plate is wobbled around a tilting axis (perpendicular to the plane of the paper in FIG. 1) with a frequency in the khz range, e.g., by an galvanometric scanner. The evaluation of the electric output signal can, thus, be performed in fractions of a second.

The evaluation of the phase in the electrical output signal can be performed with high accuracy in the order of $6\cdot10^{-3}\pi$ yielding alignment precisions in the order of 25 $\mu$m when grating constants in the order of 10 $\mu$m are used.

The phase measurement in the electrical output signal yields both the amount and the direction of the mask or wafer displacement that is required to achieve alignment. These values can be fed to a servo mechanism or alternatively to the actuator of the glass plate. In the latter case tilting of the glass plate shifts the image of mask 3 on wafer 8 prior to the exposure process so that fine alignment is achieved without further mechanical movement.

Figure 2A:
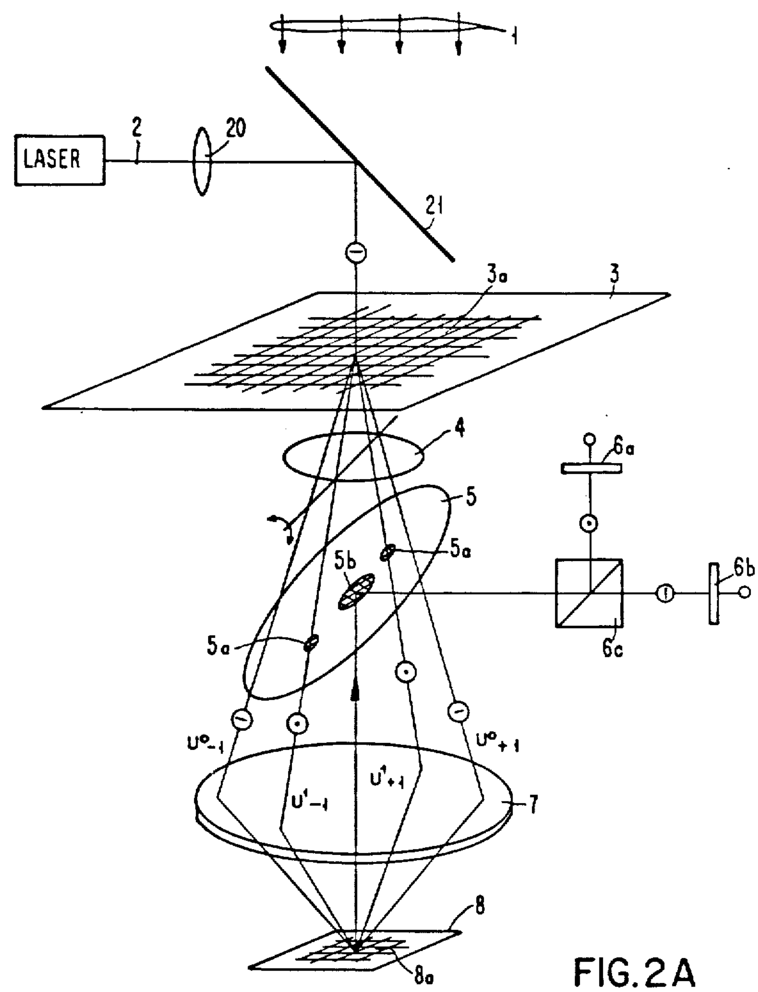
FIGS. 2A and 2B show a second embodiment of the invention which provides a two-dimensional alignment, FIG. 3 indicates in front and side views a third embodiment of the invention with an off-axis implementation in a conventional photolithographic system.
Figure 2B:
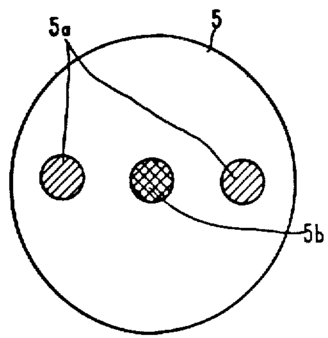

FIGS. 2A and 2B illustrate a second embodiment which allows for simultaneous alignment in two orthogonal directions, the X- and Y-directions. The incident laser beam 2 is, therefore, directed to a crossed grating 3a (with equal grating constants in both directions) to be split up into four partial beams $u^o_{-1}$, $u^1_{-1}$, $u^1_{+1}$, $u^o_{+1}$ which all traverse tiltable glass plate 4, and a modified beam splitter plate 5 to be focussed by optical system 7 into one spot on wafer 8 which carries a second crossed grating 8a that corresponds to mask grating 3a in accordance with the linear magnification of optical system 7. The axis of rotation of tilted glass plate 4 is oriented at 45° with respect to the planes defined by the two pairs of diffracted beams, so that mutual phase differences in the beam pairs are introduced by simply rotating glass plate 4.

In order to differentiate between the diffracted beams in the X- and Y-directions, beam splitter 5 has two areas 5a which are covered by a $\lambda/2$ layer at the points of intersection with the Y-partial beams $u^1_{-1}$ and $u^1_{+1}$. Thus, the polarization direction of the Y-beams is rotated by 90° with respect to the X-beams and both pairs of partial beams can be separated by polarizing beam splitter 6c and directed to corresponding photo detectors 6a and 6b. (The polarization direction of the beams is indicated in FIG. 2A by . and -, respectively).

The center of beam splitter 5 is covered by a dichroic mirror 5b which totally reflects the partial beams u, however, it is completely transparent to the exposure radiation 1.

The embodiments of FIGS. 1 and 2A and 2B use simple optical elements and can be manufactured with high precision so that the imaging quality of the optical lithographic system should not be deteriorated. This applies in particular to the thin glass plate and the low tilting angles used even in the case of optical fine alignment.

Figure 3:
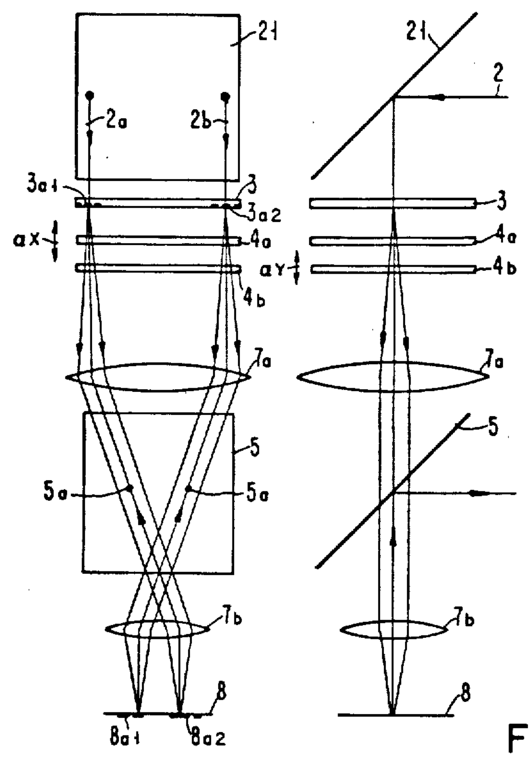

In other optical systems where geometrical constraints or quality requirements do not allow the insertion of any other optical elements, the invention may also be implemented using marginal rays. An example of such a system is indicated in FIG. 3 of the drawings.

Two laser beams 2a, 2b are directed off-axis to dichroic deflection mirror 21 and illuminate two crossed gratings $3a_1$, $3a_2$ arranged at the periphery of mask 3. The diffracted orders then pass two tiltable glass plates 4a, 4b, providing a phase shift for the X- and Y-directions, respectively. A glass plate with a 45° rotation axis could be used instead.

The optical system comprises, in this embodiment, two focussing elements 7a, 7b which image the mask gratings $3a_1$, $3a_2$ onto corresponding wafer gratings $8a_1$ and $8a_2$, respectively. The beam splitter 5, to couple out the beams diffracted at wafer masks 8a, is arranged between the system components 7a, 7b and generates two output beams at its points of intersection 5a, 5b. Each of these beams consists of two superimposed diffraction orders (e.g., +1.) and is guided separately to an associated photo detector.

Further embodiments of the invention can use higher diffraction orders (to increase the sensitivity of the method) and/or mask and wafer gratings with different constants as long as the requirement is fulfilled that colinear output beams are generated whose phase differences can be evaluated.

Instead of providing a reflecting grating on wafer 8, a transmission grating can also be used with the photodetector 6 being arranged behind this grating.

Figure 4:
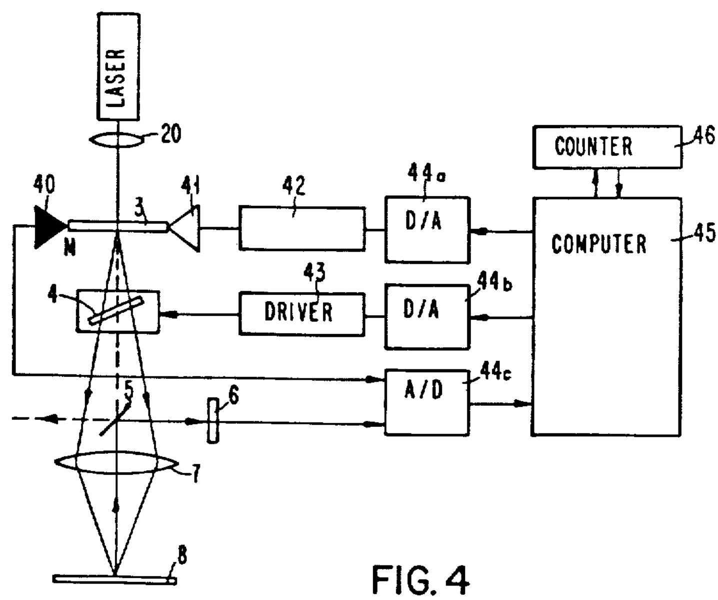
FIG. 4 shows a schematic block diagram of an embodiment with attached peripheral control devices.

In FIG. 4 of the drawings, the actuator and control elements of an embodiment are shown to be attached to a suitably programmed computer 45, e.g., a personal computer.

Computer 45 issues and receives digital signals through Digital/Analog converters 44a, 44b and Analog/Digital converters 44c, respectively. The misalignment between mask 3 and wafer 8 is indicated by a display counter 46.

In this embodiment, mask 3 can be displaced mechanically by a piezoelectric transducer 41 with an associated amplifier 42. The exact position of mask 3 is sensed by an inductive probe 40 whose output signal is converted to digital form in A/D converter 44c.

The glass plate 4 is tilted by scanner driver 43 which also sets a constant tilt angle for fine alignment after the amount of misalignment has been determined by computer 45.

While the invention has been particularly shown and described with reference to preferred embodiments thereof, it will be understood by those skilled in the art that various changes in form and details may be made therein without departing from the spirit and scope of the invention.

What is claimed is:

1. Method for aligning two objects in conjugate planes of an imaging system, said objects having first and second optical gratings, respectively, the first grating being illuminated by a light beam comprising the steps of selecting first symmetrical diffraction orders ($u^o_{+1}$, $u^o_{-1}$) from said first grating focussing said selected diffraction orders by an imaging system coincidently on said second grating so as to be diffracted a second time into second diffraction orders ($u_{+1}$, $u_{-1}$) colinear to the optical axis of said imaging system, modulating periodically the phase relationship between the first diffracted beams and evaluating the relative phase of the second diffraction orders in the colinear output beam.

2. A method as set forth in claim 1 wherein said gratings are linear and parallel to each other for alignment in a direction perpendicular to the surfaces of the gratings.

3. A method as set forth in claim 1 wherein said gratings are crossed gratings for alignment in two orthogonal directions perpendicular to the surface of the crossed gratings and wherein the polarization directions of the second diffraction orders in each orthogonal direction are perpendicular to each other.

4. A method as set forth in claims 1 wherein the relative phase of the superimposed second diffraction orders is determined by measuring the intensity after shifting the relative phase of the first diffraction orders by $\pm\frac{2}{3}\pi$.

5. A method as set forth in claims 1 wherein said first grating is part of a photolithographic mask and said second grating is part of a wafer to be exposed photolithographically.

6. A method as set forth in claims 1 wherein the optical path of the first diffracted beams is arranged at the periphery of said optical imaging system.

7. Apparatus for aligning two objects in conjugate planes of an imaging system, said objects having first and second optical gratings, respectively, said second grating being a reflective grating, comprising means for illuminating said first optical grating with vertical incidence, a tiltable glass plate arranged optically behind said first grating, and means including a semitransparent mirror arranged in the optical axis of said imaging system for directing the light diffracted at said second grating along the optical axis to a first photo detector.

8. Apparatus as set forth in claim 7 wherein each of said first and second gratings is a crossed grating, each generating a pair of diffracted beams in orthogonal planes, wherein the axis of rotation of said tiltable glass plate is arranged under 45° with respect to orthogonal planes and wherein said semitransparent mirror has areas covered by a $\lambda/2$ layer at the intersections with one pair of diffracted beams, and further including a second photo detector and a polarizing beam splitter disposed to receive the pairs of diffracted beams, said first photo detector being disposed to receive one of said pair of diffracted beams from said beam splitter and said second detector being disposed to receive the other of said pair of diffracted beams from said beam splitter.

9. Apparatus as set forth in claim 7 wherein said tiltable glass plate is oscillated by a galvanometric actuator.

10. Apparatus as set forth in claims 7 further including means for tilting said glass plate for fine adjustment of said objects by a constant angle in accordance with measured misalignment.

* * * * *